United States Patent [19]

Claverie et al.

[11] Patent Number: 4,488,305
[45] Date of Patent: Dec. 11, 1984

[54] PROTECTION DEVICE FOR A LASER DIODE

[75] Inventors: Claude Claverie; Jean-Yves Eouzan, both of Paris, France

[73] Assignee: Thomson-CSF, Paris, France

[21] Appl. No.: 591,250

[22] Filed: Mar. 21, 1984

Related U.S. Application Data

[63] Continuation of Ser. No. 328,270, Dec. 7, 1981.

[30] Foreign Application Priority Data

Dec. 9, 1980 [FR] France .................. 80 26074

[51] Int. Cl.³ .................. H01S 3/19; H01S 3/096
[52] U.S. Cl. .................. 372/38; 455/609
[58] Field of Search .................. 372/38, 44; 455/609, 455/613

[56] References Cited

U.S. PATENT DOCUMENTS 4,009,385 2/1977 Sell .................. 250/199

FOREIGN PATENT DOCUMENTS 2923683 1/1980 Fed. Rep. of Germany .
2847182 5/1980 Fed. Rep. of Germany .
2448274 8/1980 France .

Primary Examiner—James W. Davie
Attorney, Agent, or Firm—Oblon, Fisher, Spivak, McClelland & Maier

[57] ABSTRACT

The protection device for a laser diode supplied by the superimposition of a DC biasing current and a variable information-carrying current, through an opto-electronic feedback system, comprises a variable resistor connected upstream of the laser diode and of the feedback system so as to form a closed loop with the information-carrying current source and so as to ensure that the laser diode is biased before any injection of information-carrying current into this diode.

6 Claims, 4 Drawing Figures

PROTECTION DEVICE FOR A LASER DIODE

This application is a continuation of Ser. No. 328,270 filed Dec. 7, 1981.

BACKGROUND OF THE INVENTION

The present invention relates to a protection device for a laser diode and more particularly to a protection device for a laser diode used in the optical head of a videodisk system.

The laser diode used in the optical head of a videodisk system is supplied both by a DC biasing current and by a variable information-carrying current, the purpose of the DC supply being to fix a biasing point about which then occur variations relating to the reading and writing of information on the videodisk.

This laser diode is conventionally associated with an opto-electronic feedback system, whose return branch comprises a feedback photodiode and whose direct branch comprises a feedback amplifier, so as to bring under control the optical power from the laser and this despite the changes in the transfer characteristic of the diode. In fact, the transfer characteristic of the diode may change depending on the temperature or ageing. Furthermore, the transfer characteristic of the diode is such that beyond a certain threshold, this characteristic is almost vertical. Therefore, an error in the control of the supply to the laser diode risks causing immediate destruction of the laser.

Such a situation occurs particularly when the DC biasing current appears with a certain delay with respect to the information-carrying current. In fact, since the laser diode is not correctly biased when the information-carrying current appears, the signal injected into the feedback amplifier by the feedback photodiode is then very weak with respect to the information-carrying signal also injected into the amplifier. Now, it is the difference between these two signals, considerably amplified moreover by the feedback amplifier, which is applied to the laser diode. It can then be readily seen that there is a risk of destruction of the laser in such a configuration.

SUMMARY OF THE INVENTION

The present invention provides a laser diode protection device of extremely simple structure for making sure that the laser diode is biased before any injection of an information-carrying signal into this diode.

The invention also provides a feedback amplifier structure as well as a relative arrangement of this amplifier and of the protection circuit, for obtaining complete efficiency of the protection device of the invention.

According to the invention, the protection device for a laser diode supplied by the superimposition of a DC biasing current and a variable information-carrying current, through an opto-electronic feedback system, comprises a variable resistor connected upstream of the laser diode and of the feedback system so as to form a closed loop with the information-carrying current source and having a zero value when the laser diode is not supplied with DC biasing current, an infinite value when the laser diode is supplied with DC biasing current and a progressively increasing or decreasing value between these two extreme values according as to whether the laser diode passes from the condition of not being supplied with DC biasing current to the condition supplied with DC biasing current or from the condition supplied with DC biasing current to the condition not supplied with DC biasing current.

BRIEF DESCRIPTION OF THE DRAWINGS

The objects and characteristics of the present invention will appear more clearly from the following description of embodiments, said description being given with reference to the accompanying drawings in which.

DESCRIPTION OF THE PREFERRED EMBODIMENTS

Figure 1:
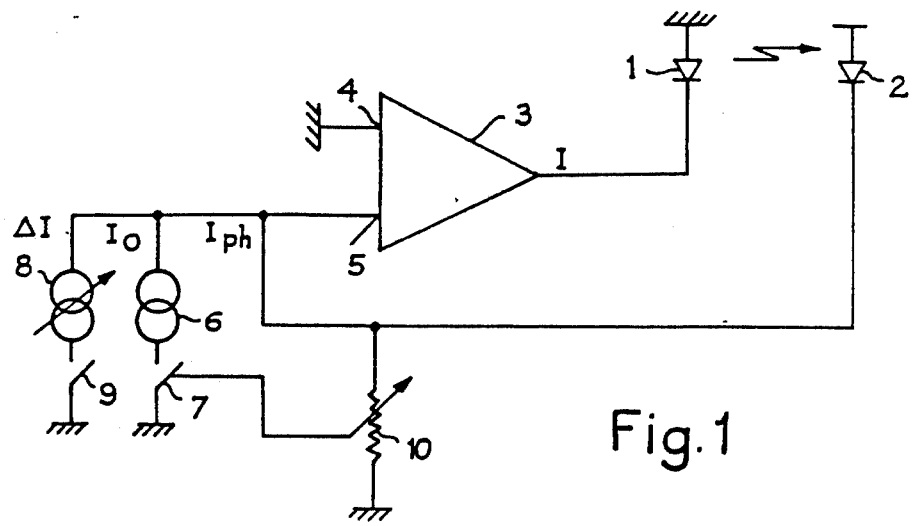
FIG. 1 is a simplified diagram of the protection device of the invention and its environment.

In FIG. 1 there is shown a laser diode 1 supplied with a current I provided by a feedback system comprising a feedback photodiode 2 and a feedback amplifier 3. The feedback amplifier 3 has a first input 4 connected to a first pole of a DC reference voltage source (not shown in the figure) and receives at its second input 5 the superimposition of a DC biasing current $I_0$ provided by a DC source brought into operation by means of a switch 7, of an information current $\Delta I$ provided by a variable current source 8 brought into service by means of a switch 9 and of a photodetected current $I_{ph}$ provided by the feedback diode.

A protection device 10 is inserted between the input 5 of the feedback amplifier 3 and the first pole of the DC reference voltage source which is connected at 4 to the driving amplifier 3. The protection device 10 consists of a resistor having a theoretically zero (i.e. very low in practice) value when switch 7 is open, a theoretically infinite (i.e. in practice very large) value when switch 7 is closed, a progressively increasing value between these two end values when switch 7 passes from the open condition to the closed condition, and a progressively decreasing value between these two end values when switch 7 passes from the closed condition to the open condition.

These variations of resistor 10 are shown symbolically in FIG. 1 by means of a broken arrow whose end is connected to the moving part of switch 7 and whose other end is connected to resistor 10.

The terminals of switches 7 and 9 which are not connected to the current sources 6 and 8 are connected to the first pole of the DC reference voltage source, the terminal of laser diode 1 which is not connected to the output of amplifier 3 is connected to the first pole of the DC reference voltage source, and the terminal of the feedback photodiode which is not connected to the input 5 of amplifier 3 is connected to the second pole of the DC reference voltage source.

When switch 9 is closed, whereas switch 7 is open, current $\Delta I$ is shunted through resistor 10 which then presents a zero resistance.

When switch 9 is closed, with switch 7 closed, the current $\Delta I$ is injected into the laser diode (through the feedback system) for resistor 10 then presents an infinite value.

When switch 9 is closed, and switch 7 passes from the open to the closed condition, current $\Delta I$ is progressively injected towards the laser diode (through the feedback system) for resistor 10 then presents a progressively increasing value between a zero value and an infinite value.

When switch 9 is closed and switch 7 passes from the closed to the open condition, the current ΔI is progressively shunted through the variable resistor 10 for resistor 10 then presents a progressively decreasing value between an infinite value and a zero value.

Thus, under all circumstances, the biasing of the laser diode precedes the injection of the information-carrying current into this same diode. The laser is thus protected in a very efficient manner.

Figure 2:
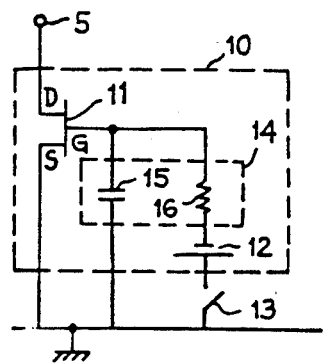
FIG. 2 is a diagram showing a first embodiment of the protection device of the invention.

In FIG. 2, the variable resistor 10 comprises a first field-effect transistor 11, whose drain D is connected to the input 5 of amplifier 3, and whose source S is connected to the first pole of the DC reference voltage source.

The variable resistor 10 also comprises a first DC biasing voltage source 12, a first pole of which is connected to the first pole of the DC reference voltage source through a switch 13.

The purpose of switch 13 is to control the switching on and the switching off of the DC biasing voltage supplied by source 12. Switches 7 and 13 are controlled simultaneously.

The polarity of source 12 and the value of the voltage which it delivers are such that transistor 11 is saturated when switch 13 is open and disabled when switch 13 is closed.

The variable resistor 10 also comprises a timing circuit 14, inserted between the DC biasing voltage source 12 and the gate G of the first field-effect transistor 11.

The timing circuit 14 comprises a capacitor 15 a first terminal of which is connected to the gate G of transistor 11 and a second terminal of which is connected to the first pole of the DC reference voltage source and a resistor 16, a first terminal of which is connected to the gate G of transistor 11 and a second terminal of which is connected to the second pole of the DC biasing voltage source 12.

With switches 7 and 13 controlled simultaneously, transistor 11 remains in a saturated condition as long as the DC biasing source 6 is not brought into operation. This transistor then presents a very low (practically zero) resistance which allows any information-carrying current ΔI which might appear at that time to be shunted through resistor 10.

When the DC biasing source 6 is brought into operation, transistor 11 passes from the saturated condition to the disabled condition and this passing over takes place progressively because of the presence of the timing circuit 14. When the timing circuit 14 is as here of the "RC" type, the voltage between the gate G and the source S of transistor 11, which is also the voltage at the terminals of capacitor 15, varies exponentially from the value "0" to tend asymptotically towards the value of the DC biasing voltage source 12.

Thus, when the DC current supplied by the DC biasing source 6 is established, the variable resistor 10 passes progressively from a zero value (transistor 11 saturated) to a theoretically infinite value, i.e. very large in practice (transistor 11 disabled), which allows any information-carrying current which might appear at that time to be progressively injected into the laser diode.

When the DC current supplied by the DC biasing source is cut off, i.e. when source 6 is made inoperative, it is the reverse phenemonon which is produced, i.e. progressive shunting through resistor 10 of a current ΔI which might appear at that time.

Figure 3:
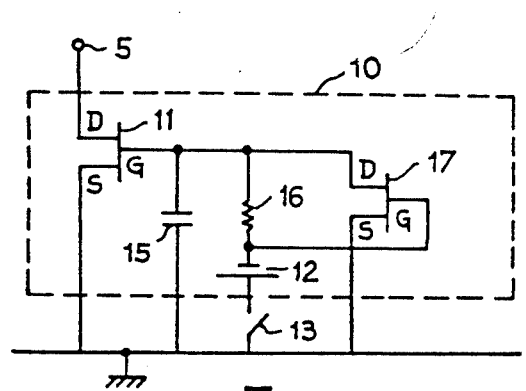
FIG. 3 is a diagram showing a second embodiment of the protection device of the invention.

The protection device shown in FIG. 3 differs from that shown in FIG. 2 solely by the addition of a second field-effect transistor 17 whose drain D is connected to the gate G of transistor 11, whose source S is connected to the source S of transistor 11 and whose gate G is connected to the second pole of the DC biasing voltage source 12.

The polarity of source 12 and the value of the voltage which it delivers are such that transistor 17 is saturated when switch 13 is open and disabled when switch 13 is closed. Transistor 17, which behaves like a variable resistor connected in parallel across capacitor 15, causes, when the DC supply current $I_0$ is switched off, capacitor 15 to be rapidly short-circuited, which results in bringing to saturation very rapidly transistor 11. The laser diode is thus protected even more efficiently when its DC biasing current $I_0$ is switched off. Transistor 17 allows the timing circuit to be rapidly reinitialized, thus preparing a new switching on.

Figure 4:
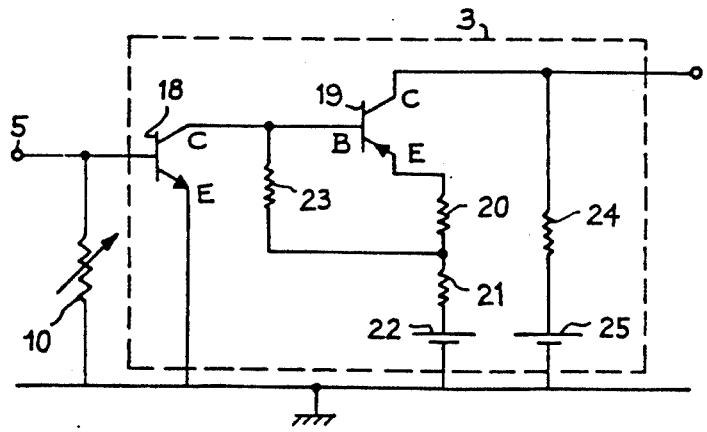
FIG. 4 is a diagram showing one embodiment of a feedback amplifier for cooperating with a protection device in accordance with the invention.

The feedback amplifier 3 shown in FIG. 4 is formed of "n" current generator-amplifier stages, connected in cascade, "n" being equal to 2 within the limits of the described embodiment.

There should be understood by current generator-amplifier a bipolar transistor with common emitter connection. It is said of several current generator-amplifiers that they are connected in cascade when the base of one of them is connected to the collector of the one which precedes it so that the disabling of one of them causes the disabling of the one which follows it if the transistors are alternatively if PNP-NPN type . . . etc.

The first stage, i.e. the first current generator-amplifier comprises a first bipolar transistor 18 whose base B forms the input 5 of the amplifier and whose emitter E is connected to the first pole of the DC reference voltage source.

The second stage, i.e. the second current generator-amplifier comprises a second bipolar transistor 19 whose base B is connected to the collector C of transistor 18, whose collector C forms the output of the amplifier, and whose emitter E is connected to the first pole of the DC reference voltage source via a first resistor 20, a second resistor 21 and a second DC biasing voltage source 22, the common point between resistors 20 and 21 being connected to the base B of transistor 14 through a third resistor 23.

The collector C of transistor 19 is also connected to the first pole of the DC reference voltage source via a fourth resistor 24 and a third DC biasing voltage source 25.

The choice of this particular structure of amplifier 3 in combination with the variable resistor 10 allows the following results to be obtained.

When the variable resistor 10 has a zero value, the first transistor of amplifier 3 is disabled, causing all the following transistors to be disabled.

It is then certain that the effects of the variable resistor are not diminished by the presence of an amplifier which might cause shunting of current to the laser diode.

The structure of the feedback amplifier in accordance with the invention allows then full advantage to be taken of the efficiency of the protection device in accordance with the invention.

What is claimed is:

1. A protection device for a laser diode comprising:

feedback means connected between the output of said laser diode and the input of said laser diode;

first switching means for supplying to said feedback means a DC biasing current provided by a DC biasing current source;

second switching means for supplying to said feedback means an information carrying current provided by an information carrying current source when said second switch means is in a closed position;

variable resistor means connected to said feedback means and forming a closed loop with said information carrying current source, wherein said variable resistor means is controlled by the operation of said first switch means to provide a resistance value of zero when said first switch means is in an open position and a resistance value of infinity when said first switch means is in a closed position, and wherein the value of said resistance progressively increases between said zero value and said infinity value when the position of said first switch means proceeds from an open to a closed position and wherein the value of said resistance progressively decreases between said infinity value and said zero value when the position of said first switch means proceeds from an open to an closed position, in order to ensure that the biasing of said laser diode by said bias current precedes the input of said information-carrying current into said diode.

2. The device as claimed in claim 1, wherein said variable resistor means comprises a first field-effect transistor whose drain forms a first terminal of said variable resistor means, a DC biasing voltage source and a timing circuit connected between the drain of said first field-effect transistor and a first pole of said DC biasing voltage source, the source of said first field-effect transistor and a second pole of said DC biasing voltage source being connected together so as to form a second terminal of said variable resistor means, the switching on and off of the DC biasing voltage and of the DC biasing current being controlled simultaneously.

3. The device as claimed in claim 2, wherein said timing circuit comprises a resistor a first terminal of which is connected to the first pole of said DC biasing voltage source and a capacitor a first terminal of which is connected to a second terminal of said resistor and a second terminal of which is connected to the second pole of said DC biasing voltage source, the common point between said resistor and said capacitor being connected to the gate of said first field-effect transistor.

4. The device as claimed in claim 2, wherein said variable resistor means also comprises a second field-effect transistor whose gate is connected to the first pole of said DC biasing voltage source, whose drain is connected to the gate of said first field-effect transistor and whose source is connected to the second ple of said DC biasing voltage source.

5. The device as claimed in claim 1, in which said feedback means comprises a feedback amplifier, wherein said feedback amplifier is connected by means of "n" cascade-connected generator-amplifiers ("n" being a whole number), the input of the first generator amplifier being connected to the common point between said variable resistor means and said information-carrying current source.

6. A circuit for safely driving a laser diode from a DC biasing current source and from an information carrying current source, said circuit comprising:

current generator amplifier means having an output feeding a current to said laser diode and an input;

optoelectronic feedback means optically coupled to said laser diode and electrically connected to said input;

said DC biasing current source being switched on and switched off for supplying to said input a DC biasing current;

said DC biasing current being provided to cooperate with an information carrying current fed to said input by said information carrying current source;

variable resistor means connected accross said input and responsive to switching on and switching off of said DC biasing current source; said switching on causing the resistance value of said variable resistor means to progressively raise from a short circuit value to an open circuit value; said switching off causing the resistance value of said variable resistor means to drop from said open circuit value to said short circuit value thereby preventing failure of said laser diode by overload arising from weakened transient operation of said optoelectronic feedback means.

* * * * *